United States Patent [19]

Idei

[11] Patent Number: 5,073,806
[45] Date of Patent: Dec. 17, 1991

[54] SEMICONDUCTOR LIGHT EMITTING ELEMENT WITH GROOVES

[75] Inventor: Yasuo Idei, Tama, Japan

[73] Assignee: Kabushiki Kaisha Toshiba, Kawasaki, Japan

[21] Appl. No.: 599,230

[22] Filed: Oct. 17, 1990

[30] Foreign Application Priority Data

Oct. 17, 1989 [JP] Japan ................ 1-269316

[51] Int. Cl.[5] .......................................... H01L 33/00
[52] U.S. Cl. ............................. 357/17; 357/16; 357/55; 372/48; 372/46; 372/50
[58] Field of Search ............ 357/17, 16, 55; 372/43, 372/44, 45, 46, 47, 48

[56] References Cited

U.S. PATENT DOCUMENTS

| 3,930,912 | 1/1976 | Wisbey ........................ 156/3 |
| 4,751,711 | 6/1988 | Welch et al. ............... 372/46 X |
| 4,845,405 | 4/1989 | Yamane et al. ............. 313/500 |
| 4,894,835 | 1/1990 | Uomi et al. .................. 372/45 |
| 4,914,669 | 4/1990 | Matsui et al. ............... 372/48 X |
| 4,947,401 | 8/1990 | Hinata et al. ............... 372/45 X |

FOREIGN PATENT DOCUMENTS 62-196874  2/1988  Japan .
63-120491 10/1988  Japan .
63-169775 11/1988  Japan .

OTHER PUBLICATIONS

T. Sugahara, et al., "High Radiance AlGaAs DH LED Array by MBE", *Fujitsu-Scientific and Technical Journal*, vol. 19, No. 3, 1983, Kawasaki JP, pp. 315-322.

K. Fukuoka et al., "High-Power Infrared LED for Autofocus", *Toshiba Review*, vol. 41, No. 2, pp. 145-148, Feb. 1986.

English Language Abstract for Japanese Pat. 63-169775.

*Primary Examiner*—William A. Mintel
*Attorney, Agent, or Firm*—Foley & Lardner

[57] ABSTRACT

To form a semiconductor light emitting element provided with three light emitting portions into a monolithic structure, the element of double heterojunction structure has a p-type GaAs semiconductor substrate, an n-type GaAlAs current restriction layer formed with conductive regions arranged at regular intervals, a p-type GaAlAs cladding layer, a p-type GaAlAs active layer, an n-type GaAlAs cladding layer, and two grooves formed extending from the surface of the n-type GaAlAs cladding layer deep through the p-type GaAlAs active layer and between the two adjacent conductive regions. Since the three light emitting portions are formed at precise intervals in a monolithic structure, when mounted on a camera for use with an automatic focusing mechanism, it is possible to measure a distance to a subject in trigonometrical survey without the subject being out of focus.

2 Claims, 1 Drawing Sheet

SEMICONDUCTOR LIGHT EMITTING ELEMENT WITH GROOVES

BACKGROUND OF THE INVENTION

The present invention relates to a semiconductor light emitting element, and more particularly to a light emitting element suitable for use as an infrared light source for an automatic focusing (AF) mechanism assembled in a camera.

Recently, GaAlAs infrared light emitting diodes are widely used as a light source of infrared rays for a camera's automatic focusing mechanism. Infrared rays emitted therefrom are passed through a collimator lens into a parallel beam, emitted toward a subject, and then reflected from the subject. The light reflected from the subject is sensed by a light receiving element, and a distance to the subject is measured in accordance with a trigonometrical survey method.

The above-mentioned infrared light emitting element was disclosed in Japanese Patent Laid-open (Kokai) No. 63-169775 (1988), for instance, FIG. 3 is a cross-sectional view of this prior-art element, in which an n-type current restriction layer 5 is formed on a p-type GaAs semiconductor substrate 6 by a liquid phase epitaxial growth method (referred to as LPE method, hereinafter), and further Zn atoms are diffused into part of the n-type current restriction layer 5 to form p-type range by selective diffusion technique. Further, a p-type GaAlAs cladding layer 4, a p-type GaAlAs active layer 3, and an n-type GaAlAs cladding layer 2 are formed in sequence on the n-type current restriction layer 5 a in stacking manner for improvement of the productivity. Further, an ohmic electrode 1 of an AuGe alloy is formed on the surface of the n-type GaAlAs clad layer 2 and another ohmic electrode 7 of an AuBe alloy is formed on the surface of the p-type semiconductor substrate 6.

In this element, a GaAlAs double heterojunction (referred to as DH structure, hereinafter) is adopted to increase the emitted light power; the light emitting portion 9 is narrowed into a point light source so that the emitted light can reach a farthest possible position to increase the measurable distance; and the current restriction layer (region) 5 is formed inside the pellet to prevent other regions from emitting light. Further, since it is necessary to determine the wavelength of the emitted light reflected from the subject and received by the element, to be approximately 860 nm, in order to increase the sensitivity to infrared rays emitted to a subject, the mixed crystal ratio of AlAs in the p-type GaAlAs active layer 3 is set to 0.03.

Light emitting elements thus constructed as described above, have been widely used at present, and the quantity of production of these elements is increasing year by year. However, when a single light emitting element is used as a light source for the AF mechanism and therefore light is emitted from a single point, there exist some cases where a subject is taken in out-of-focus status. In more detail, in the AF camera in general, a subject is brought into focus at the central portion within a finder. Therefore, where a portrait is taken, if a person is not located at the central portion of the finder, an object behind the person is brought into focus. The rate at which the above-mentioned out-of-focus occurs is about 20% in the case where the camera emits AF light from a single point.

To overcome the above-mentioned problem, a method of mounting three light sources to emit light from three different points has been proposed. In this method, however, precision as high as ±50 μm or less is required for the distance intervals between the two light sources. This is because when three light emitting elements are activated in sequence in response to a pulse signal to emit beams through lenses toward a subject and the light reflected from the subject is received by a light receiving element, if each distance between two light emitting elements is offset from a predetermined value, three reflected rays are not focused on the light receiving element simultaneously, so that it is impossible to bring the subject into focus.

In the conventional method, however, the distance precision between two light emitting elements has been about 200 μm at the most, because these light emitting elements are mounted on each camera frame by hand. In addition, although each light emitting element is cut away from a semiconductor wafer by dicing, since the positional offset (dispersion) in the dicing process is generally ±15 μm, even if the mounting precision of the elements on a camera frame is improved, it is impossible to prevent the distance intervals between the two light emitting elements from being offset from a predetermined value. Therefore, the method of mounting three light emitting elements on a camera for prevention of out-of-focus problem lies only at a stage of an idea, without being so far realized.

SUMMARY OF THE INVENTION

With these problems in mind, therefore, it is the primary object of the present invention to provide semiconductor light emitting elements which can satisfy the mutual distance interval precision required when three light emitting portions are arranged, to effectively prevent a subject from being out of focus and thus realize the three point light emitting method.

To achieve the above-mentioned object, the present invention provides a semiconductor light emitting element, comprising: (a) a double heterostructure structure such that an n-type GaAlAs current restriction layer formed with a conductive region is formed on a p-type GaAs semiconductor substrate, and, furthermore a p-type GaAlAs cladding layer, a p-type GaAlAs active layer and an n-type GaAlAs clad layer are formed in sequence on a surface of the current restriction layer in a stacking beginning with the p-type cladding layer; (b) a plurality of conductive regions formed at predetermined regular intervals in the n-type GaAlAs current restriction layer; and (c) a plurality of grooves formed extending from the surface of the n-type GaAlAs clad deep through the p-type GaAlAs active layer so as to be located between the two conductive regions, whereby a plurality of monolithic light emitting portions are provided.

In the semiconductor light emitting element of double heterojunction structure according to the present invention, since a plurality of conductive regions are formed at predetermined regular intervals on an n-type current restriction layer and additionally, a plurality of grooves are formed extending from the surface of the n-type GaAlAs clad layer deep through the p-type GaAlAs active layer so as to be located between two adjacent conductive regions, a plurality of monolithic light emitting portions can be provided. Therefore, it is possible to arrange a plurality of light emitting portions at predetermined regular intervals at high positional precision, so that it is possible to prevent a subject from being out of focus when the element is used with the AF mechanism for a camera to measure a distance to a subject by emitting light from plural points.

Here, with respect to the n-type $Ga_{1-x}Al_xAs$ current restriction layer, it is preferable that the mixed crystal ratio x is from 0 to 0.4; the impurity atom concentration is from $1 \times 10^{17}$ cm$^{-3}$ to $20 \times 10^{17}$ cm$^{-3}$; and the thickness is from 1 μm to 20 μm. When the mixed crystal ratio x is more than 0.4, an oxide film is easily formed on the surface thereof. When the impurity atom concentration is less than $1 \times 10^{17}$ cm$^{-3}$, the dopant Zn for the semiconductor substrate is thermal-diffused to invert the conductive regions during the process when this layer is being grown. When the concentration is more than $20 \times 10^{17}$ cm$^{-3}$, the crystallization quality deteriorates and therefore the optical output is reduced. When the thickness is less than 1 μm, the dopant Zn for the substrate is diffused to invert the n-type GaAlAs layer 5. When the thickness is more than 20 μm, it becomes difficult to form the conductive regions by inversion in the current restriction layer in accordance with the selective diffusion technique or to form the conductive regions into isotropic shape in accordance with the selective etching technique.

Further, with respect to the n-type $Ga_{1-y}Al_yAs$ cladding layer, it is preferable that the mixed crystal ratio y is from 0.03 to 0.8; the impurity atom concentration is from $1 \times 10^{17}$ cm$^{-3}$ to $20 \times 10^{17}$ cm$^{-3}$; and the thickness is from 2 μm to 50 μm. The effect of confining the carrier can be obtained when the mixed crystal ratio y is kept from 0.03 to 0.8. Further, the forward voltage VF can be reduced when the impurity atom concentration is kept from $1 \times 10^{17}$ cm$^{-3}$ to $20 \times 10^{17}$ cm$^{-3}$. Further, when the thickness is less than 2 μm, the series resistance increases and thus the forward voltage VF increases. When the thickness is more than 50 μm, there exists a problem in that cracks may be produced in the semiconductor wafer after grooves have been formed in the wafer by dicing or etching.

BRIEF DESCRIPTION OF THE DRAWINGS

In the attached drawings.

DESCRIPTION OF THE PREFERRED EMBODIMENTS

Embodiments of the semiconductor light emitting element according to the present invention will be described hereinbelow with reference to the attached drawings.

Figure 1:
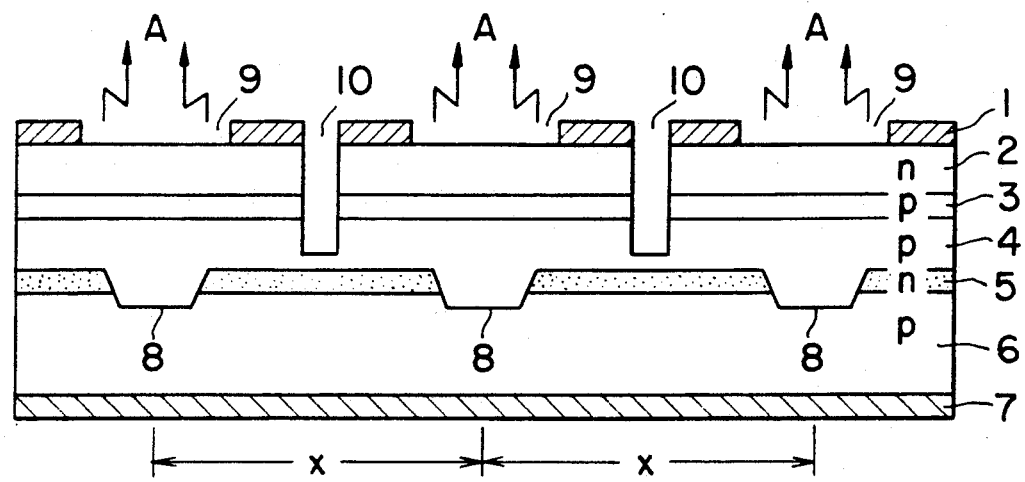
FIG. 1 is a longitudinal cross-sectional view showing the structure of an embodiment of the semiconductor light emitting element according to the present invention.
Figure 2:
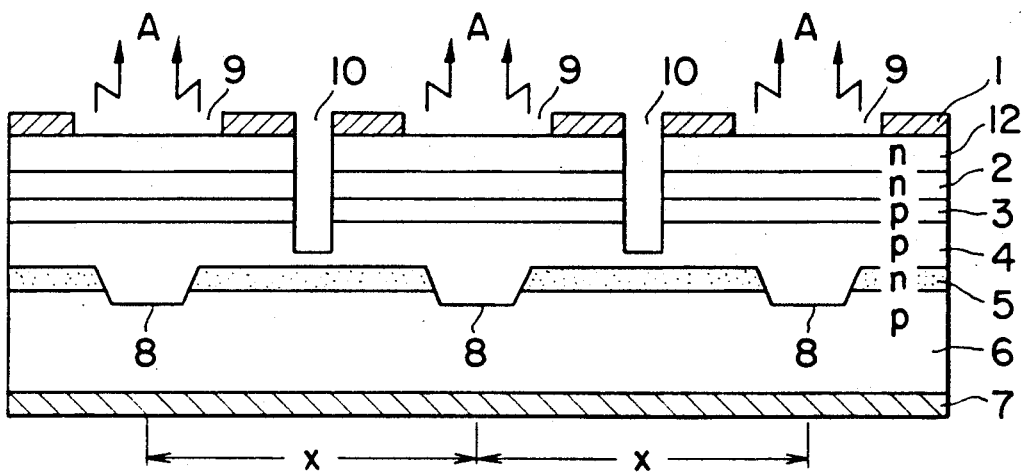
FIG. 2 is a similar longitudinal cross-sectional view showing the structure of another embodiment thereof.
Figure 3:
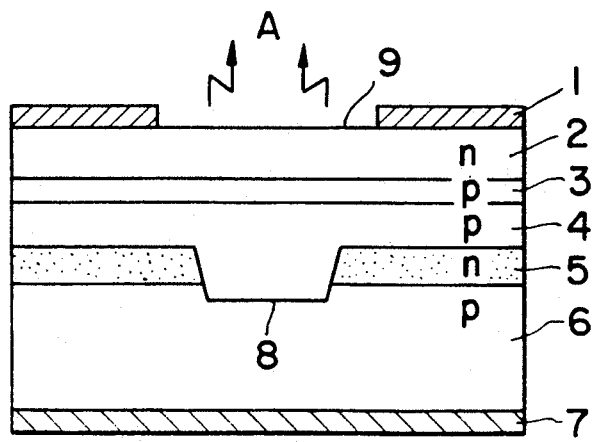
FIG. 3 is a similar longitudinal cross-sectional view showing the structure of a prior-art semiconductor light emitting element.

FIG. 1 shows a cross-sectional structure of an embodiment of the semiconductor light emitting element, in which three light emitting portions are formed into a monolithic structure, being different from the prior-art element shown in FIG. 3. In the light emitting element of the present invention, basically, various layers are formed in accordance with LPE method in the same way as in the prior-art element. However, a current restriction layer 5 is so formed that a plurality of light emitting portions are arranged at regular intervals, for instance such as 500 μm.

First, an n-type GaAs layer 5 as the current restriction layer is formed on the surface of a 300 μm-thick p-type GaAs semiconductor substrate 6 in accordance with the LPE method. In this process, tellurium (Te) is injected at an impurity atom concentration of $5 \times 10^{17}$ cm$^{-3}$. The thickness of this layer 5 is 5 μm. Conductive regions 8 are formed at regular intervals of 500 μm on the n-type GaAs layer 5 by selective diffusion technique or selective etching technique. In the case of the selective diffusion technique, the conductive regions 8 are formed by diffusing Zn to the layer 5 to invert only the portions where the conductive regions 8 are to be formed, into a p-type GaAs layer with a mask of patterned silicon nitride ($Si_3N_4$) film. In the case of the selective etching technique, the conductive regions 8 are formed by removing the n-type GaAs layer 5 only at the portions where the conductive regions 8 are to be formed, deep into the p-type GaAs layer 6 by etching with a mask of resist. In this embodiment, although the impurity atom concentration of the n-type GaAs layer 5 is $5 \times 10^{17}$ cm$^{-3}$ and the thickness thereof is 5 μm, it is preferable that the concentration be limited within a range from 1 to $20 \times 10^{17}$ cm$^{-3}$ and the thickness be limited within a range from 1 to 20 μm. This is because when the concentration is less than $1 \times 10^{17}$ cm$^{-3}$, the conductive regions 8 are inverted by thermal diffusion of the dopant Zn from the p-type GaAs semiconductor substrate 6 when the double hetero (DH) layer is being grown. On the other hand, when the concentration is more than $20 \times 10^{17}$ cm$^{-3}$, the crystallization quality of the n-type GaAs layer 5 is deteriorated, and further the crystallization quality of the DH layer grown on the layer 5 is also deteriorated, so that the optical output during conduction is reduced. Furthermore, when the thickness is less than 1 μm, the n-type GaAs layer 5 is inverted by the thermal diffusion of dopant Zn from the p-type GaAs semiconductor substrate 6. In contrast, when the thickness is more than 20 μm, it is impossible to form the conductive regions 8 by inverting them into a p-type range of Zn diffusion in the case of the selective diffusion technique, and also it is difficult to form the conductive regions 8 into an isotropic shape in the case of the selective etching technique.

After the current restriction layer 5 formed with conductive regions 8 has been formed as described above, a p-type $Ga_{0.7}Al_{0.3}As$ cladding layer 4 is formed on the surface of the layer 5 by the LPE method. In this embodiment, the impurity atom concentration of injected Ge is $1 \times 10^{18}$ cm$^{-3}$ and the layer thickness is 5 μm. Further, a p-type $Ga_{0.97}Al_{0.03}As$ active layer 3 and an n-type $Ga_{0.7}Al_{0.3}As$ clad layer 2 are formed in sequence by the LPE method. In the p-type GaAlAs active layer 3, the impurity atom concentration of injected Si is $5 \times 10^{17}$ cm$^{-3}$, and the layer thickness is 1.5 μm. In the n-type GaAlAs cladding layer 2, the impurity atom concentration of injected Te is $1 \times 10^{18}$ cm$^{-3}$ and the layer thickness is 10 μm. Here, the reason why the impurity atom concentrations of the two cladding layers 2 and 4 are determined to a higher value, respectively, is to reduce the forward voltage VF of the element. Furthermore, the mixed crystal ratio of Al of each of the two cladding layers 2 and 4 is set to 0.30 to enhance the specific advantage of the DH structure which can confine the carrier. Furthermore, the mixed crystal ratio of the p-type active layer 3 is so determined as to emit light with a wavelength of about 860 nm at which the highest light receiving sensitivity can be expected. Further, the mixed crystal ratio y of Al and Ga of the n-type clad layer 2 is set more than 0.03 to reduce the reabsorption of the emitted light into the p-type active layer 3 at the above wavelength. However, when the mixed crystal ratio y is set more than 0.8, since there exists a tendency that an oxide film is easily formed on the surface of the n-type clad layer 2, it is impossible to obtain ohmic characteristics in the n-type GaAlAs layer, so that the forward voltage VF increases. Furthermore, the impurity atom concentration of the n-type clad layer 2 must be within a range from $1 \times 10^{17}$ cm$^{-3}$ to $20 \times 10^{17}$ cm$^{-3}$. This is because if it is less than $1 \times 10^{17}$ cm$^{-3}$, the specific resistance of the n-type cladding layer 2 becomes high and therefore the forward voltage VF increases, but if it is more than $20 \times 10^{17}$ cm$^{-3}$, Te injected as impurity atoms is segregated to deteriorate the crystallization quality, so that the optical output is reduced.

Furthermore, an ohmic electrode 7 of an AuBe alloy is formed on the surface of the p-type GaAs substrate 6, and another ohmic electrode 1 of an AuGe alloy is formed on the surface of the n-type GaAlAs cladding layer 2. Furthermore, three 150 μm-dia. electrode aperture portions 9 are formed in the electrode 1 and over the 100 μm-dia. conductive regions 8 so that light can be emitted in the direction of the arrow (A).

Thereafter, 20 μm-deep grooves 10 are formed in the semiconductor wafer by dicing or etching deep through the pn junction portion between the cladding layer 2 and the active layer 3 of the DH structure for isolation of the active layer 3, so that the three light emitting portions are conducted independently to emit light separately. Thereafter, each element provided with three light emitting portions is cut off from the semiconductor wafer as a pellet by the ordinary dicing method.

In this embodiment, the element is of three layer double hetero structure formed of the p-type cladding layer 4, the p-type active layer 3 and the n-type cladding layer 2. However, it should be noted that the isolation of the p-type active layer 3 is indispensable by forming the grooves 10 through the active layer 2 deep into the n-type cladding layer 4 by dicing or etching. Therefore, the thickness of the n-type cladding layer 2 must be within a range of from 2 to 50 μm, preferably within a range from 3 to 40 μm. This is because if the thickness thereof is less than 2 μm, the series resistance is high so that the forward voltage VF increases, and if more than 50 μm, since a groove cutting depth increases up to 60 μm, there exists a problem in that cracks may be produced in the wafer at the succeeding process or after.

As described above in the semiconductor light emitting element of the present invention, since the element is formed with three independent light emitting portions of a monolithic structure, it is possible to determine each interval X between the two light emitting portions at such a high precision as 50 μm beyond that required for when the element is used with an AF mechanism for a camera, for instance. In other words, it is possible to adopt the trigonometrical survey to measure a distance between a camera and a subject to be taken thereby by emitting light from three different positions without out-of-focus to the subject. In the prior-art camera for emitting light from a single position for distance measurement, the general probability of out-of-focus is about 20%. In contrast with this, in the camera provided with the element of the present invention which emits light from three independent positions, it is possible to markedly reduce the same probability down to about 2%.

In the above-mentioned embodiment, the current restriction layer 5 is the n-type GaAs layer. Without being limited thereto, it is also possible to form the same layer 5 by an n-type Ga$_{1-x}$Al$_x$As (mixed crystal) layer. In this case, however, it is necessary to determine the mixed crystal ratio thereof to be less than 0.4, because when the mixed crystal ratio is excessively high, an oxide film is formed on the surface thereof so that an excellent DH epitaxial layer is unobtainable. Further, the impurity atom concentration and the epitaxial layer thickness must be within ranges from $1 \times 10^{17}$ cm$^{-3}$ to $20 \times 10^{17}$ cm$^{-3}$ to from 1 μm and 20 μm, respectively as with the case of the afore-mentioned embodiment of the n-type GaAs layer.

Furthermore, in FIG. 1, although the element is formed of three-layer construction, it is also possible to adopt a four-layer construction by further forming an n-type Ga$_{1-z}$Al$_z$As layer 12 serving as a contact layer on the n-type Ga$_{1-y}$Al$_y$As cladding layer 2, in order to reduce the forward voltage VF. In this case, if the relationship between the two mixed crystal ratios (z and y) of Ga and Al is z<y, the smaller z is; that is, the closer the n-type Ga$_{1-z}$Al$_z$As layer 12 is to the GaAs layer, the smaller will be the resistivity where the carrier concentration is kept constant. In other words, it is preferable to form an n-type GaAs layer (z=0) 12 to reduce the forward voltage VF. On the other hand, it is necessary to determine the mixed crystal ratio z of the n-type contact layer 12 to be at least 0.03 and more preferably 0.05 or more, in order that light emitted from the vicinity of the p-type Ga$_{0.97}$Al$_{0.03}$As active layer 3 is outputted without reabsorption. If the mixed crystal ratio z of the contact layer 12 is 0.8 or more, this results in an increase in the forward voltage VF for the same reason as in the n-type cladding layer 2. Similarly, the impurity atom concentration of the contact layer 12 must be within the same range from $1 \times 10^{17}$ cm$^{-3}$ to $20 \times 10^{17}$ cm$^{-3}$. On the other hand, the thickness of the epitaxial layer must be between 2 μm and 50 μm including the n-type Ga$_{1-y}$Al$_y$As cladding layer 2 and the n-type Ga$_{1-z}$Al$_z$As contact layer 12 in combination.

Furthermore, only the element provided with three light emitting portions has been described. However, it is also possible to form the element provided with two or four or more light emitting portions into a monolithic structure, according to the requirements of the camera's AF function.

The planar arrangement of this structure can be either linear, rectangular or have some other arbitrary arrangement.

What is claimed is:

1. A semiconductor light emitting element, comprising:
   (a) a double heterojunction structure such that an n-type GaAlAs current restriction layer formed with a conductive region is formed on a p-type GaAs semiconductor substrate, and, furthermore, a p-type GaAlAs cladding layer, a p-type GaAlAs active layer and an n-type GaAlAs cladding layer are formed in sequence on a surface of the current restriction layer in a stacking manner beginning with the p-type cladding layer;
   (b) a plurality of conductive regions formed at predetermined intervals in the n-type GaAlAs current restriction layer; and (c) a plurality of grooves formed extending from the surface of the n-type GaAlAs cladding layer through the p-type GaAlAs active layer so as to be located between the two conductive regions, whereby a plurality of monolithic light emitting portions are provided.

2. The semiconductor light emitting element of claim 1, wherein the n-type GaAlAs current restriction layer is an n-type $Ga_{1-x}Al_xAs$ layer whose mixed crystal ratio of Al lies within a range from 0 to 0.4, whose impurity atom concentration lies within a range from $1 \times 10^{17}$ cm$^{-3}$ to $20 \times 10^{17}$ cm$^{-3}$, and whose thickness lies within a range from 1 $\mu$m to 20 $\mu$m; and the n-type GaAlAs cladding layer is an n-type $Ga_{1-y}Al_yAs$ layer whose mixed crystal ratio of Ga and Al lies within a range from 0.03 to 0.8, whose impurity atom concentration lies within a range from $1 \times 10^{17}$ cm$^{-3}$ to $20 \times 10^{17}$ cm$^{-3}$ and whose thickness lies within a range from 2 $\mu$m to 50 $\mu$m.

* * * * *